United States Patent [19]

Mohara

[11] Patent Number: 4,867,569
[45] Date of Patent: Sep. 19, 1989

[54] APPARATUS FOR DETECTING A POSITION OF AN ELECTRONIC PART

[75] Inventor: Masayuki Mohara, Oizumimachi, Japan

[73] Assignee: Sanyo Electric Co., Ltd., Japan

[21] Appl. No.: 84,962

[22] Filed: Aug. 13, 1987

[30] Foreign Application Priority Data

Aug. 22, 1986 [JP] Japan .................. 61-197907

[51] Int. Cl.⁴ ............................. B01B 11/00
[52] U.S. Cl. ....................... 356/375; 29/721; 29/759; 358/101
[58] Field of Search ............ 356/138, 375, 399; 29/720, 721, 729, 740, 754, 703; 364/488, 484, 490, 491, 513; 901/40, 47; 358/101

[56] References Cited

U.S. PATENT DOCUMENTS

| | | | |
|---|---|---|---|
| 4,575,637 | 3/1986 | Sullivan, Jr. | 356/375 |
| 4,608,494 | 8/1986 | Kobayashi et al. | 356/400 |
| 4,628,464 | 12/1986 | McConnell | 358/101 |
| 4,747,198 | 5/1988 | Asai et al. | 29/721 |
| 4,793,707 | 12/1988 | Hata et al. | 356/375 |

FOREIGN PATENT DOCUMENTS 0066631 12/1981 .
1925215 11/1970 Fed. Rep. of Germany .
2643810 3/1978 Fed. Rep. of Germany .
103700 6/1985 Japan .

OTHER PUBLICATIONS

IBM Technical Disclosure Bulletin, vol. 24, No. 6—Nov. 1981, p. 2937.
Elektrotechnik, vol. 65, No. 20, Oct. 1983, pp. 76, 77.

Primary Examiner—F. L. Evans
Attorney, Agent, or Firm—Darby & Darby

[57] ABSTRACT

Disclosed is an apparatus for detecting a position of an electronic part, the apparatus comprising first and second light source arranged so that an electronic part attracted by attraction means is sandwiched therebetween, a diffusion plate provided between the attraction means and the second light sources, and an imaging means provided below the diffusion plate. The light from the first light sources is irradiated on the electronic part and the transmission light from the electronic part is applied to the imaging means, or the light from the second light sources is irradiated on the electronic part and the reflected light is selectively applied to the imaging means through a through-hole of the diffusion plate to detect a position of the electronic part.

10 Claims, 3 Drawing Sheets

APPARATUS FOR DETECTING A POSITION OF AN ELECTRONIC PART

BACKGROUND OF THE INVENTION (1) Field of the Invention

The present invention relates to an apparatus for detecting a position of an electronic part, which includes, for example, such as resistors, capacitors, ICs and the like, which the apparatus is used when said part after having been removed out of a stick or a part storage space is attracted by attraction means, after which said part is mounted in place on a substrate, such as a printed circuit board.

(2) Description of the Prior Art

Generally, in an automatic mounting apparatus for electronic parts called a mount apparatus for automatically mounting passive elements such as capacitors or semiconductor elements such as diodes, ICs, etc. in place on a substrate, where after said electronic part has been removed out of a part storage space or a stick, the part is transferred by attraction means to a predetermined location on the substrate, it is necessary to detect a position (attitude) of the electronic part attracted to the end of said attraction means (nozzle). As for one example, Japanese Patent Application Laid-Open No. 60-103,700 discloses a system in which a conductor pattern on the print circuit board substrate is subjected to imaging as a pattern image by fluorescence.

Among semiconductor elements, LSIs shown in FIGS. 7 (a) and (b), respectively, that is, LSI called QFP (Quad Flat Package) and LSI called LCC (Leadless Chip Carrier) or PLCC (Plastic Leadless Chip Carrier) have been recently widely used. In the illumination of light (illumination light) merely from one side, the aforesaid QFP involves no problem since a terminal pin 2 is projected from a package body 1. However, in the case of the aforesaid LCC, since a terminal pin 4 is not protruded from a package body 3, imaging by use of a so-called transmission light causes recognition to be very obscure and there is the remotest chance of detecting position.

In the aforementioned prior examples, in the former example, a conductor pattern on a print substrate need be processed into a fluorescent pattern, and in addition, in the case of an electronic part such as the LCC which is not protruded from the package as previously mentioned, it is difficult to perform detection of position, which produces a disadvantage in that a lead terminal cannot be subjected to imaging.

SUMMARY OF THE INVENTION

It is therefore an object of the present invention to provide a new apparatus for detecting a position of an electronic part while removing the above-described disadvantages.

According to the present invention, there is provided an arrangement which comprises first and second light sources arranged at positions, respectively, between which is sandwiched an electronic part attracted by an attraction nozzle, a diffusion plate provided between said attraction nozzle and said second light sources, and an imaging means provided below said diffusion plate, wherein the light from said first light sources is irradiated on said electronic part and the transmission light from said electronic part is applied to said imaging means, or the light from said second light sources is irradiated on said electronic part and the reflected light is selectively applied to said imaging means through a through-hole of said diffusion plate to detect a position of said electronic part.

In the present invention, the light sources are suitably switched according to the state whether or not the terminal pin is protruded from the package body as in electronic parts, particularly LSI, and an image may be obtained by the imaging device.

DESCRIPTION OF THE PREFERRED EMBODIMENTS

Figure 1:
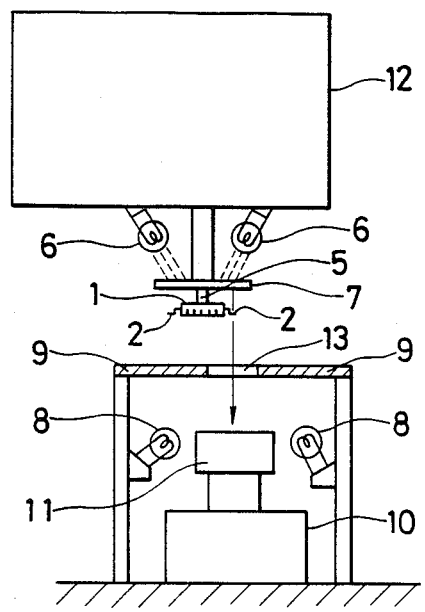
FIGS. 1 and 2 are respectively front views of essential parts showing one embodiment of an apparatus for detecting a position of an electronic part according to the present invention.

In the drawings, the same elements as those described in connection with the aforementioned prior art are indicated by the same reference numerals. Reference numeral 5 designates an attraction nozzle for attracting and transferring an electronic part; 6, a first light source; 7, an upper diffusion plate; 8, a second light source; 9, a lower diffusion plate; 10, an imaging means having a lens 11; and 12, an XY moving head having the attraction nozzle.

The above-described upper diffusion plate 7 and lower diffusion plate 9 are formed, for example, from frosted glass which generates scattered light at the surface portion, or an indirect illumination member formed of a polyacetal resin which generates scattered light internally.

Figure 5:
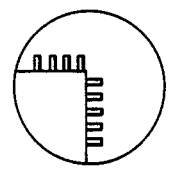
FIGS. 5 and 6 illustrate the imaging state in FIGS. 1 and 3.

The operation of the apparatus according to the present invention will now be described with reference to FIGS. 1 and 2. First, in the case of QFP (Quad Flat Package) type IC (hereinafter referred to as QFP) in which a terminal pin 2 is projected (overflows) from a package body 1, for example, when the QFP is removed out of a stick (not shown) and thereafter the QFP as an electronic part is attracted by the attraction nozzle 5, the first light sources 6 are turned on as shown in FIG. 1 to irradiate light on the upper diffusion plate 7. Thereby the terminal pin 2 of the QFP is irradiated through a through-hole 13 of the lower diffusion plate 9, the transmission light moves downward as indicated by the arrow to reach the imaging means 10, and an image caused by the transmission light is obtained, assuming the state view shown in FIG. 5.

Figure 2:
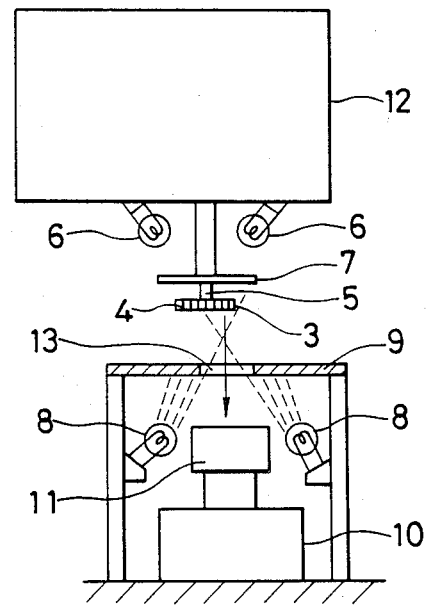

On the other hand, in the case of the LSI (hereinafter referred to as LCC) of the type called LCC (Leadless Chip Carrier) or PLCC (Plastic Leadless Chip Carrier), when the LCC is removed out of a stick and thereafter the package body 1 of LCC is attracted by the attraction nozzle 5, in a manner similar to the former, the second light sources 8 are turned on as shown in FIG. 2 whereby the terminal pin 3 of LCC is irradiated by the light from the through-hole 13 of the lower diffusion plate 9, and the reflected light reaches the imaging plate 10. The image caused by the imaging means 10 assumes the state view as shown in FIG. 4.

Figure 3:
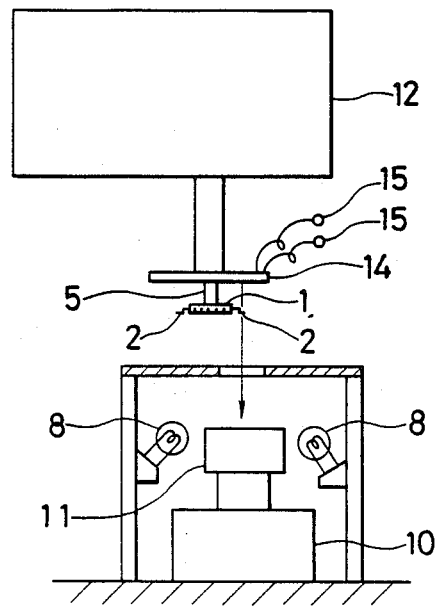
FIGS. 3 and 4 are respectively front views of essential parts shown a further embodiment of the present invention.

FIG. 3 shows an example which uses an electroluminescent lamp 14 having a planar face from which light is emitted (merely referred to as EL) in place of the upper diffusion plate and the first light sources in the embodiments shown in FIGS. 1 and 2. In FIG. 3, when the position detection of the terminal pin 3 of QFP is carried out, a voltage is applied to terminals 15 and 15 of the EL 14 to irradiate the light on the terminal pin 2 of the QFP, and an image caused by the irradiated light is imaged by the imaging means 10 through a through-hole 13. Then the respective terminal pins of the QFP may be detected in position in the manner similar to that shown in FIG. 1.

Figure 6:
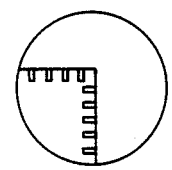
Figure 7A:
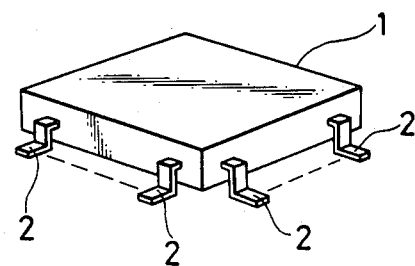
FIGS. 7 (a) and 7 (b) are perspective views of QFP and LCC, respectively, which are electronic parts.
Figure 7B:
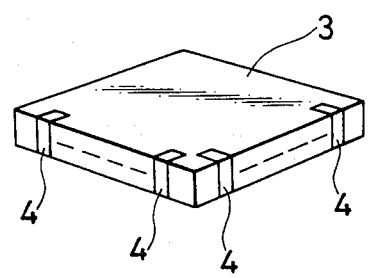

According to another embodiment, when the first light source 6 and the upper diffusion plate 7 are mounted on a support leg 16, when the terminal pin 2 of the QFP is imaged likewise the FIG. 1 embodiment, the light is irradiated thereon by the first light source 6 through the upper diffusion plate 7 to effect the position detection with the transmission light. In this case, the image plane caused by the imaging means assumes the state view shown in FIG. 6.

Figure 4:
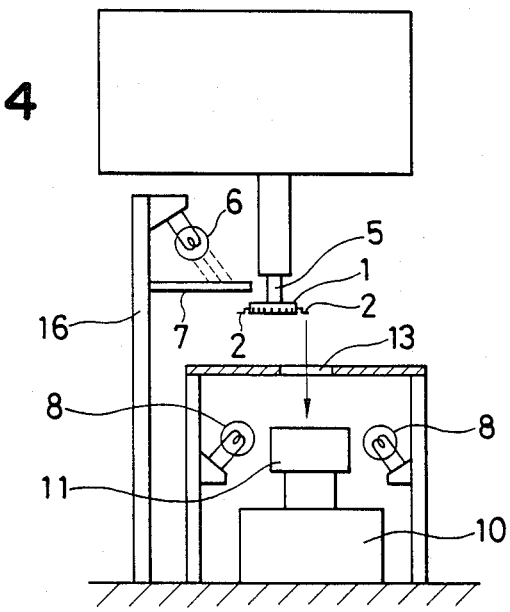

It is noted in FIG. 3 as well as FIG. 4 that when the position detection of LCC is effected, the light from the second light sources 8 is irradiated on the package body 3 of LCC from the bottom, and the reflected light having passed through the through-hole 13 reaches the imagining means 10, similarly to the FIG. 2 embodiment.

The QFP, LCC, etc. as the electronic parts are mounted in place on the print substrate (not shown) through the above-described position detection process, and the position detection in a state of being attracted by the attraction nozzle 5 is carried out accurately. For example, a computer which stores a normal attracted position reads a deviation between the normal attracted position and a detected position, and the attraction nozzle is displaced through the deviation to mount an electronic part on a print substrate or a table on which a print substrate is disposed is moved through the deviation, after which an electronic part is mounted, then the precision of mounting electronic parts may be enhanced.

According to the apparatus for detecting a position of an electronic part of the present invention, the terminal pins of the leadless type LSI called LCC or PLCC which has many terminal pins and has been considered to be very difficult in detection, may be detected by the reflected light. In addition, an LC of the QFP type in which a terminal pin is protruded from a package body may be positiondetected by the transmission light. Furthermore, position detections of electronic parts of either type of IC in which a terminal pin is protruded from a package body or a type in which a terminal pin is not projected therefrom can be selectively carried out. For this reason, the range of use of the apparatus may be extended. Therefore, the detection operation is easy, which leads to the enhancement of mounting accuracy in the after-mounting process. Thus, the present is advantageously utilized for a position detector in automatic mounting or automatic insertion of electronic parts.

What is claimed is:

1. An apparatus for detecting a position of an electronic part, comprising:
   (a) attraction means for attracting and holding an electronic part;
   (b) a light source disposed below said attraction means;
   (c) a diffusion plate disposed between said light source and an electronic part held by said attraction means, said diffusion plate having a light transparent area; and
   (d) imaging means disposed below said diffusion plate,
   (e) the light produced by said light source being irradiated onto the bottom surface of said electronic part held by said attraction means through said diffusion plate, and reflected light from the bottom surface of said part is applied to said imaging means through said diffusion plate light transparent area to detect a position of said part.

2. An apparatus for detecting a position of an electronic part comprising: attraction means for attracting and holding an electronic part, first and second light sources arranged at positions, respectively, between which is sandwiched an electronic part attracted and held by said attraction means, a light diffusion plate having a light transparent area located between said attraction means and said second light source, and an imaging means provided below said diffusion plate, the light from said first light source being irradiated on the top of said electronic part and the light transmitted past the circumferential portion of said electronic part is applied to said imaging means through said light transparent area in said diffusion plate, or the light from said second light source is irradiated by said diffusion plate on the bottom surface of said electronic part and the reflected light therefrom is applied to said imaging means through said diffusion plate light transparent area to detect a position of said electronic part.

3. An apparatus according to claim 2 further comprising a second diffusion plate between said first light source and the electronic part to be held by said attracting means.

4. An apparatus according to claim 3, further comprising a support leg on which the first light source and said second diffusion plate are mounted.

5. An apparatus according to claim 2 wherein said first light source is a light source disposed above the electronic part to be held by said attracting means, said first light source having a luminous face emitting light therefrom onto the top and beyond the circumference of the electronic part toward said imaging means.

6. An apparatus according to claim 5 wherein said first light source comprises an electroluminescent plate.

7. An apparatus for detecting a position of an electronic part comprising:
   attraction means for attracting and holding said electronic part;
   a light source disposed above said attraction means having a luminous face emitting light therefrom onto the top and beyond the circumference of the electronic part to be held by said attracting means;
   imaging means disposed below said attraction means and the electronic part to be held thereby to detect a position of said part.

8. An apparatus according to claim 7, wherein said light source comprises an electroluminescent plate.

9. An apparatus for detecting a position of an electronic part comprising:
   (a) attraction means for attracting and holding an electronic part;
   (b) a support leg;

(c) a light source mounted on said support leg disposed above said attraction means;
(d) a light diffusion plate mounted on said support leg disposed between said light source and an electronic part to be held by said attraction means;
(e) imaging means disposed below said diffusion plate; and
(f) the light produced by said light source transmitted past the circumferential portion of the electronic part being applied to said imaging means to detect a position of said part.

10. An apparatus for detecting a position of an electronic part comprising:
(a) attraction means for attracting and holding an electronic part having a top and a bottom surface,
(b) imaging means located with respect to the bottom surface of said electronic part to receive light reflected from said bottom surface,
(c) and means for providing light to illuminate the bottom surface of said electronic part to be reflected therefrom to said imaging means to detect the position of the part.

* * * * *